United States Patent
Hayashishita (10) Patent No.: US 11,984,341 B2
(45) Date of Patent: May 14, 2024

(54) COMPONENT-MANUFACTURING TOOL AND COMPONENT-MANUFACTURING METHOD

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 915 days.

(21) Appl. No.: 16/610,161

(22) PCT Filed: May 8, 2018

(86) PCT No.: PCT/JP2018/017833
§ 371 (c)(1),
(2) Date: Nov. 1, 2019

(87) PCT Pub. No.: WO2018/207793
PCT Pub. Date: Nov. 15, 2018

(65) Prior Publication Data
US 2020/0075382 A1    Mar. 5, 2020

(30) Foreign Application Priority Data

May 11, 2017    (JP) .................. 2017-095082

(51) Int. Cl.
*H01L 21/683* (2006.01)
*C09J 7/20* (2018.01)
(Continued)

(52) U.S. Cl.
CPC .............. *H01L 21/683* (2013.01); *C09J 7/20* (2018.01); *G03F 7/707* (2013.01); *H01L 2021/6015* (2013.01)

(58) Field of Classification Search
CPC .. H01L 21/683; H01L 2021/6015; C09J 7/20; G03F 7/707
See application file for complete search history.

(56) References Cited

U.S. PATENT DOCUMENTS 4,921,564 A * 5/1990 Moore .................... H01L 21/68
156/701
5,273,615 A * 12/1993 Asetta ................... B23B 31/307
269/21

(Continued)

FOREIGN PATENT DOCUMENTS

JP    H08330372 A    12/1996
JP    2012114265 A    6/2012
(Continued)

OTHER PUBLICATIONS

English machine translation of WO2017002610 A1 to Hayashishita, Jan. 5, 2017, 19 pages. (Year: 2017).*

(Continued)

*Primary Examiner* — Linda L Gray
(74) *Attorney, Agent, or Firm* — BUCHANAN, INGERSOLL & ROONEY PC (57) ABSTRACT

A component-manufacturing tool includes a frame body and a holding film covering an opening, wherein the frame body includes a first frame and a second frame; the holding film includes a base layer and a holding layer provided on one surface of the base layer, and the holding film is sandwiched and held between the first frame and the second frame in a stretched state; and a ratio $R_{E1}$ (=E'(100)/E'(25)) of an elastic modulus E'(100° C.) of the base layer to an elastic modulus E'(25° C.) of the base layer is $0.2 \leq R_{E1} \leq 1$, and E'(25) is 35 MPa or more and 3500 MPa or less. A component-manufacturing method includes a component holding step of holding components to the holding layer of the component-manufacturing tool; and a chucking step of chucking and (Continued)

fixing the holding film, to which holds the components, to a surface of a heated chuck table.

4 Claims, 5 Drawing Sheets

(51) Int. Cl.
*G03F 7/00* (2006.01)
*H01L 21/60* (2006.01)

(56) References Cited

U.S. PATENT DOCUMENTS

| | | | |
|---|---|---|---|
| 5,534,102 | A * | 7/1996 | Kadono ............... H01L 21/302 438/464 |
| 5,605,844 | A | 2/1997 | Oki et al. |
| 9,966,297 | B2 | 5/2018 | Morimoto et al. |
| 10,483,131 | B2 | 11/2019 | Hayashishita |
| 10,858,547 | B2 | 12/2020 | Hayashishita |
| 11,535,776 | B2 | 12/2022 | Hayashishita |
| 2016/0133500 | A1 | 5/2016 | Morimoto et al. |
| 2018/0142130 | A1 | 5/2018 | Hayashishita |
| 2018/0158697 | A1 | 6/2018 | Hayashishita |
| 2021/0047543 | A1 | 2/2021 | Hayashishita |

FOREIGN PATENT DOCUMENTS

| | | |
|---|---|---|
| JP | 2012188597 A | 10/2012 |
| JP | 2013084794 A | 5/2013 |
| SG | 189515 A1 | 5/2013 |
| TW | 201316393 A | 4/2013 |
| TW | 201701375 A | 1/2017 |
| WO | 2014192630 A1 | 12/2014 |
| WO | 2016/199819 A1 | 12/2016 |
| WO | 2017002610 A1 | 1/2017 |

OTHER PUBLICATIONS

Office Action dated Sep. 2, 2021, by the Taiwan Intellectual Property Office in corresponding Taiwanese Patent Application No. 107115230, and an English translation of the Office Action. (17 pages).

Office Action (Patent Refusal Decision) dated Mar. 16, 2022, by the Department of Economics Affairs in corresponding Taiwanese Patent Application No. 107115230, and an English translation of the Office Action. (7 pages).

Notice of Reasons for Refusal dated Aug. 17, 2021, by the Japanese Patent Office in corresponding Japanese Patent Application No. 2019-517647 and an English translation of the Notice. (14 pages).

Office Action (First Office Action) dated Dec. 1, 2022 by the Chinese Patent Office in corresponding Chinese Patent Application No. 201880030718.1, and an English translation of the Office Action. (15 pages).

International Search Report (PCT/ISA/210) and translation and Written Opinion (PCT/ISA/237) dated Jul. 31, 2018, by the Japanese Patent Office as the International Searching Authority for International Application No. PCT/JP2018/017833.

Notification of Reason for Refusal dated Feb. 23, 2021, by the Korean Patent Office in corresponding Korean Patent Application No. 10-2019-7032847, and an English Translation of the Notification. (10 pages).

Extended European Search Report dated Jan. 22, 2021, issued by the European Patent Office in corresponding European Application No. 18797556.0-1211, (9 pages).

Office Action (Communication pursuant to Article 94(3) EPC) dated Nov. 25, 2022, by the European Patent Office in corresponding European Patent Application No. 18 797 556.0. (8 pages).

Office Action dated Feb. 21, 2023, by the Taiwan Intellectual Property Office in corresponding Taiwanese Patent Application No. 107115230, and an English Translation of the Office Action. (27 pages).

Reexamination Office Action (Rejection Decision) dated Sep. 6, 2023, by the Taiwan Intellectual Property Office in corresponding Taiwanese Patent Application No. 107115230, and an English translation of the Office Action. (17 pages).

\* cited by examiner

COMPONENT-MANUFACTURING TOOL AND COMPONENT-MANUFACTURING METHOD

TECHNICAL FIELD

The present invention relates to a component-manufacturing tool and a component-manufacturing method. More in detail, the present invention relates to a component-manufacturing tool to be used in semiconductor component manufacturing, a component-manufacturing method for manufacturing a semiconductor component, a component-manufacturing tool to be used in electronic component manufacturing, and a component-manufacturing method for manufacturing an electronic component.

BACKGROUND ART

In recent years, there is known a manufacturing method of a semiconductor component in which a wafer on which circuits are formed is divided, then the divided semiconductor components are evaluated (inspected), and only semiconductor components that have passed the evaluation are picked up and sent to subsequent steps. This manufacturing method is disclosed, for example, in Patent Literature 1 below (see claims 1 to 3, and the like). Thereby, a yield rate of the final products can be improved.

CITATIONS LIST

Patent Literature

Patent Literature 1: JP H08-330372 A
Patent Literature 2: JP 2013-084794 A

SUMMARY OF INVENTION

Technical Problems

In order to use this method, it is necessary to carry out three steps of division (dicing), evaluation, and pickup. In this case, a component is arranged and processed on a carrier (an adhesive sheet, a jig, or the like), but a characteristic required of the carrier is different in each step, so that it is handled by changing to a carrier as needed, each time.

For example, in Patent Literature 2, a ring frame (a "first frame body 5" in Patent Literature 2) on which a film is stretched is used in a dividing step (see FIG. 7(A) of Patent Literature 2), but when the dividing step transitions to a pickup step thereafter, a grip ring (a "second frame body 7" in Patent Literature 2) is used (see FIGS. 8(C) and 8(D) of Patent Literature 2). A pickup property can be secured by stretching the film with the grip ring so as to increase a gap between components on the film. Further, with the use of the grip ring, a necessary area, to which the components are adhered, can only be separated from the ring frame to be used.

However, Patent Literature 2 does not specifically disclose a film capable of performing such an operation. Also, an evaluation step is not taken into consideration in Patent Literature 2. The evaluation step generally includes evaluation using heat addition, such as operation confirmation under a heated environment and accelerated evaluation using heat stress load. Therefore, in addition to mechanical strength and flexibility required in the division and pickup, the carrier is also required to have heat resistance and mechanical strength and flexibility after heat endurance; however, these points have not been studied at all.

Patent Literature 1 discloses a career that can be used in the evaluation step. That is, Patent Literature 1 discloses a technique in which by using a film subjected to heat shrink in advance as the carrier, a room for stretch in the subsequent steps can be obtained, whereby a shift between an evaluation electrode pad 111 and a bump 103 (see FIG. 15 of Patent Literature 1), due to a thermal expansion difference, can be eliminated. As described above, shrink and stretch of a film, occurring due to an influence of heat, greatly affects position accuracy in the evaluation step, and it can be understood that in manufacturing steps including the evaluation step, heat management at a higher level is required, compared to manufacturing steps where division and pickup are only performed.

However, how to deal with the following chucking failure has not been studied in Patent Literature 1.

The present inventors have studied various materials, and have repeated tests to select a carrier material that can balance more required characteristics. As a result, it has been known that when a material, flexible to such an extent that a gap can be formed between components, is selected for the film to acquire a pickup property, a failure that the carrier cannot be fixed to a chuck table occurs. That is, it has been found that when the carrier is tried to be chucked and fixed to a heated chuck table, wrinkles may occur in the film, so that airtight leakage from a wrinkle portion may be caused, whereby the failure that the carrier cannot be normally chucked to the chuck table may occur.

The present invention has been made in view of the above problem, and an object of the present invention is to provide a component-manufacturing tool, by which a carrier can be surely chucked to a chuck table even under a heated environment, and a component-manufacturing method using this component-manufacturing tool.

Solutions to Problems

That is, the present invention is as follows.

[1] A component-manufacturing tool used in a method of a semiconductor component or a method of an electronic component, the tool comprising:
a frame body having an opening, and a holding film stretched on the frame body so as to cover the opening, in which:
the frame body includes a ring-shaped first frame, and a ring-shaped second frame that can be engaged with the first frame;
the holding film includes a base layer and a holding layer provided on one surface of the base layer, and is sandwiched and held between the first frame and the second frame in a stretched state; and
a ratio $R_{E1}(=E'(100)/E'(25))$ of an elastic modulus $E'(100)$ at 100° C. of the base layer to an elastic modulus $E'(25)$ at 25° C. of the base layer is $0.2 \leq R_{E1} \leq 1$, and $E'(25)$ is 35 MPa or more and 3500 MPa or less.

[2] The component-manufacturing tool according to claim 1, in which a linear thermal expansion coefficient of the base layer is 100 ppm/K or more.

[3] The component-manufacturing tool according to claim 1 or claim 2, in which the base layer contains at least one of a thermoplastic polyester-based elastomer, a thermoplastic polyamide-based elastomer, and polybutylene terephthalate.

[4] The component-manufacturing tool according to any one of claims 1 to 3, in which the manufacturing method includes a chucking step where the holding film, by the holding layer of which a plurality of components selected from a semiconductor component, a precursor of the semiconductor component, an electronic component, and a precursor of the electronic component are held, is chucked and fixed to a surface of a heated chuck table.

[5] The component-manufacturing tool according to claim 4, in which the manufacturing method includes, after the chucking step, an evaluation step where the components held by the holding film are evaluated.

[6] The component-manufacturing tool according to claim 5, in which the manufacturing method includes, after the evaluation step, a pickup step where only a part of the components is pushed from a side of the base layer toward a side of the holding layer to further stretch the holding film, so that the components is separated from the other components and is picked up.

[7] A component-manufacturing method includes:

a component holding step where a plurality of components selected from a semiconductor component, a precursor of the semiconductor component, an electronic component, and a precursor of the electronic component are held by a holding layer of a component-manufacturing tool that includes a frame body having an opening, and a holding film stretched on the frame body and covers the opening,
the frame body including a ring-shaped first frame and a ring-shaped second frame that can be engaged with the first frame,
the holding film including a base layer and the holding layer provided on one surface of the base layer and being sandwiched and held between the first frame and the second frame in a stretched state, and
a ratio $R_{E1}(=E'(100)/E'(25))$ of an elastic modulus $E'(100)$ at 100° C. of the base layer to an elastic modulus $E'(25)$ at 25° C. of the base layer being $0.2<R_{E1}\leq 1$ and $E'(25)$ being 35 MPa or more and 3500 MPa or less; and a chucking step where the holding film, by which the components are held, is chucked and fixed to a surface of a heated chuck table.

[8] The component-manufacturing method according to claim 7, including, after the chucking step, an evaluation step where the components held by the holding film are evaluated.

[9] The component-manufacturing method according to claim 8, including, after the evaluation step, a pickup step where only a part of the components is pushed from a side of the base layer toward a side of the holding layer to further stretch the holding film, so that the component is separated from the other components and is picked up.

Advantageous Effects of Invention

According to the present component-manufacturing tool, the holding film can be surely chucked to a chuck table even under a heated environment. Therefore, in a component-manufacturing method including an evaluation step performed under a heated environment, components can be manufactured by using the present component-manufacturing tool. Further, a career can be shared in each of the evaluation step and the pickup step by using the present component-manufacturing tool.

According to the present method, the component-manufacture tool can be surely chucked to a chuck table even under a heated environment. Therefore, the present component-manufacturing method including an evaluation step performed under a heated environment can be performed.

Further, a career can be shared in each of the evaluation step and the pickup step by the present manufacturing method.

DESCRIPTION OF EMBODIMENTS

Hereinafter, the present invention will be described with reference to the drawings. Matters indicated here are illustrative and for illustratively explaining embodiments of the present invention, and are described for the purpose of providing explanation that seems to be most effective and easiest for understanding of the principle and conceptual features of the present invention. In this respect, it is not intended to present the structural details of the present invention to a certain degree or more necessary for fundamental understanding of the present invention, and it is intended to clearly teach those skilled in the art how some forms of the present invention are actually embodied by using explanation in combination with the drawings.

[1] Component-Manufacturing Tool

The present component-manufacturing tool (1) is one to be used in a manufacturing method of a component (50). Examples of the component (50) include a semiconductor component (51) and an electronic component (54).

The present component-manufacturing tool (1) includes a frame body (10) having an opening (10h), and a holding film (20) stretched on the frame body (10) and covers the opening (10h).

Of these, the frame body (10) includes a ring-shaped first frame (11), and a ring-shaped second frame (12) that can be engaged with the first frame (11). On the other hand, the holding film (20) is sandwiched and held between the first frame (11) and the second frame (12) in a stretched state.

The holding film (20) includes a base layer (21) and a holding layer (22) provided on a side of one surface (21a) of the base layer (21). Of these, a ratio $R_{E1}(=E'(100)/E'(25))$ of an elastic modulus $E'(100)$ at 100° C. of the base layer (21) to an elastic modulus $E'(25)$ at 25° C. of the base layer (21) is $0.2\leq R_{E1}\leq 1$, and $E'(25)$ is 35 MPa or more and 3500 MPa or less (see FIG. 1).

With the component-manufacturing tool 1 having the above configuration, a component-manufacturing tool, which can be surely chucked to a chuck table even under a heated environment, can be provided. That is, even if the present component-manufacturing tool 1 is chucked and fixed to a heated chuck table, wrinkles are not caused in the holding film 20 stretched on the frame body 10 and airtight leakage is not caused, whereby the component-manufacturing tool 1 can be normally chucked and fixed to the chuck table. Thereby, normal evaluation can be performed in an evaluation step. That is, for example, an unintended shift between a component 50 to be evaluated and an evaluation device (e.g., a probe) or the like is prevented during evaluation, whereby the evaluation can be performed normally. Further, a gap can be formed, before the evaluation step, between the divided components by using the present component-manufacturing tool 1, and hence contact between the components is prevented during a time when the dividing step transitions to the evaluation step, whereby a failure, which may be caused by the contact between the components during the transition, can be prevented.

A usage form and a distribution form of the present component-manufacturing tool 1 are not particularly limited, but in use, the components 50 are usually mounted on the holding film 20.

The chuck table is a device including a table (top board) having a smooth top face, which is a device that can chuck the holding film 20, as is stretched on the frame body 10, to the smooth top face by chuck. The above table is not particularly limited, but it usually has a structure capable of chucking. That is, for example, a molded body (a metal molded body, a ceramic molded body, a resin molded body, or the like) having a chucking route such as a chucking hole or a chucking groove, or a porous molded body (a metal molded body, a ceramic molded body, a resin molded body, or the like), can be used.

<1> Frame Body

Figure 2:
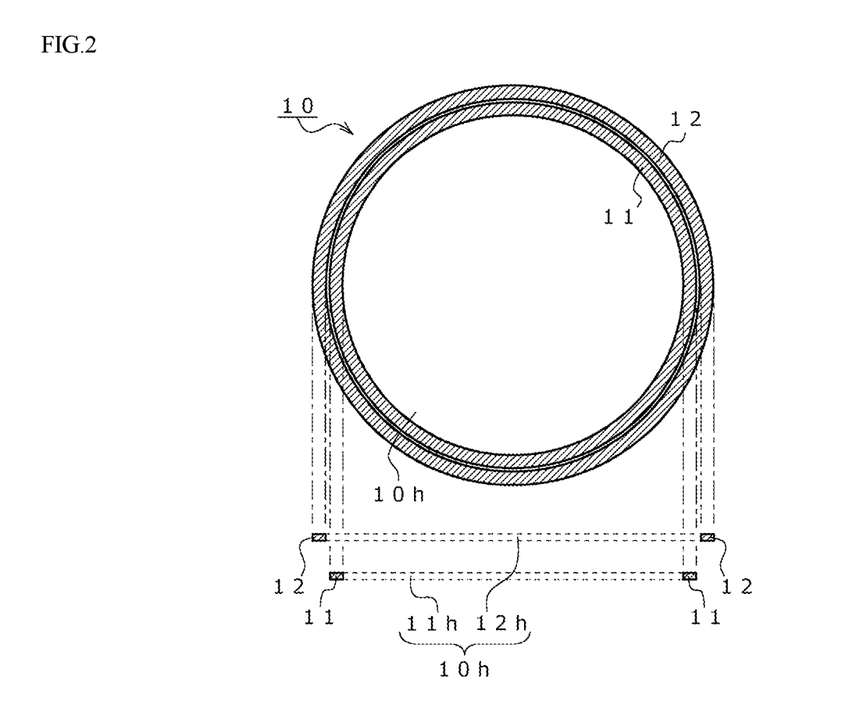
FIG. 2 is an explanatory view for explaining a frame body that constitutes the present component-manufacturing tool.

The frame body 10 (see FIG. 2) includes the first frame 11 and the second frame 12. The first frame 11 is ring-shaped and has an opening 11h. Similarly, the second frame 12 is ring-shaped and has an opening 12h. The first frame 11 and the second frame 12 can be engaged with each other, and the first frame 11 and the second frame 12 are integrated by engaging the first frame 11 and the second frame 12 together, so that they form the frame body 10. Also, the opening 11h and the opening 12h are integrated by engaging the first frame 11 and the second frame 12 together, so that they form the opening 10h. The constituent material of each of the first frame 11 and the second frame 12 is not limited, and various types of organic materials (resins, elastomers, and the like) and inorganic materials (metals, ceramics, and the like) can be appropriately used, if needed. Of these, examples of the organic materials include, for example, a polycarbonate resin, an ABS resin, a polyester resin (an aromatic polyester resin, a liquid crystalline polyester resin, or the like), a polyamide resin (an aromatic polyamide resin, or the like), a polyimide resin, a polyamide imide resin, and the like. These may be used alone or in combination of two or more. With these organic materials, reinforcing members, such as inorganic material fillers, inorganic material reinforcements (glass fibers, carbon fibers, and the like), organic material fillers, and organic material reinforcing fibers (aromatic polyamide resin fibers, and the like), can be further blended. Of course, the reinforcing members may also be used alone or in combination of two or more.

The engagement form between the first frame 11 and the second frame 12 is not limited. For example, an engagement form is mentioned, in which the outer diameter of the first frame 11 is made smaller than the inner diameter of the second frame 12, as illustrated in FIGS. 1(a) and 1(b). That is, in this form, the engagement can be made by fitting the inner circumference of the second frame 12 into the outer circumference of the first frame 11. In this case, the holding film 20 can be held while being stretched by sandwiching the holding film 20 between the outer circumferential surface of the first frame 11 and the inner circumferential surface of the second frame 12 (see FIG. 1(b')). Further, more secure engagement can be made in this form by providing a convex portion 111 for engagement on the outer circumferential surface of the first frame 11 and a concave portion 121 for engagement on the inner circumferential surface of the second frame 12, as illustrated in FIG. 1(b").

Figure 1:
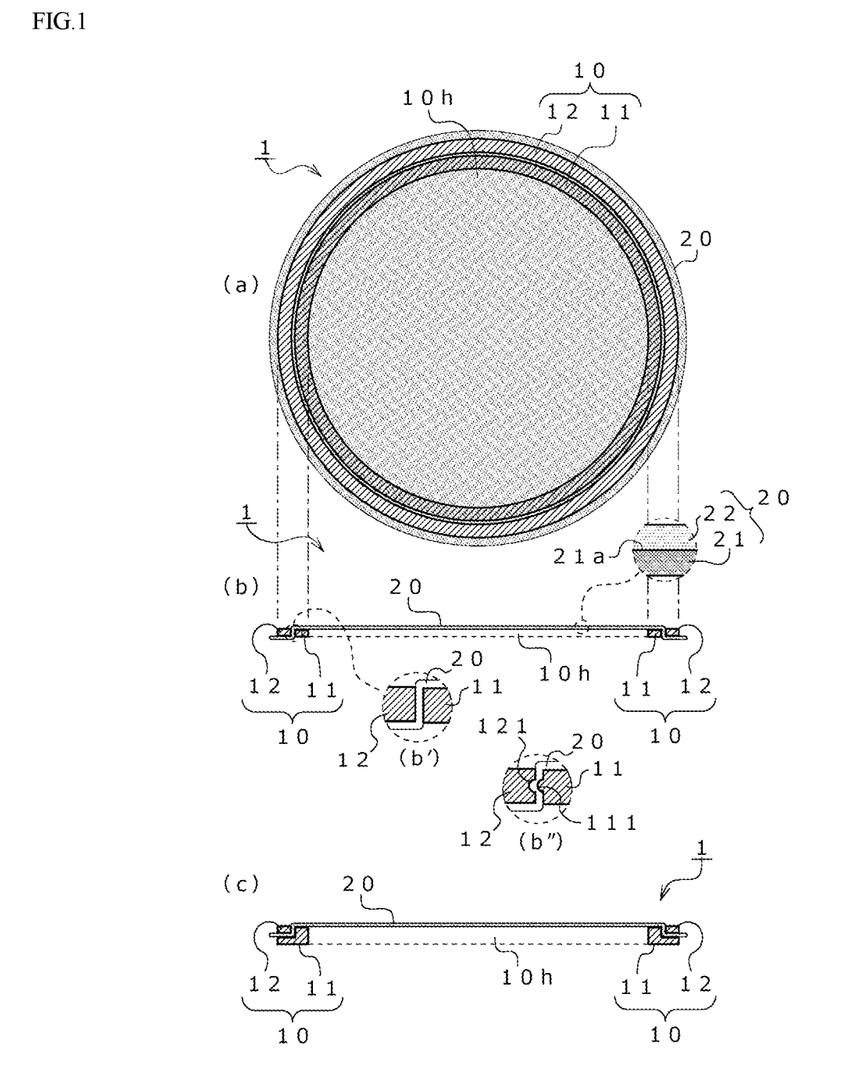
FIG. 1 is an explanatory view for explaining a planar form of one example of the present component-manufacturing tool (a), a corresponding sectional form (b), and another variation of the corresponding sectional form (c).

Furthermore, the first frame 11 can have a shape in which a portion of the first frame 11 is cut out such that the outer diameter of part of the first frame 11 becomes smaller than the inner diameter of the second frame 12, as illustrated in FIGS. 1(a) and 1(c). With this shape, the second frame 12 can be prevented from falling out to the side opposite to the side into which the first frame 11 is fitted, on and after the engagement.

The engagement may be made possible only by adjusting an engagement clearance between the first frame 11 and the second frame 12, but the engagement state can also be maintained by using, for example, magnetic force or the like.

Figure 3:
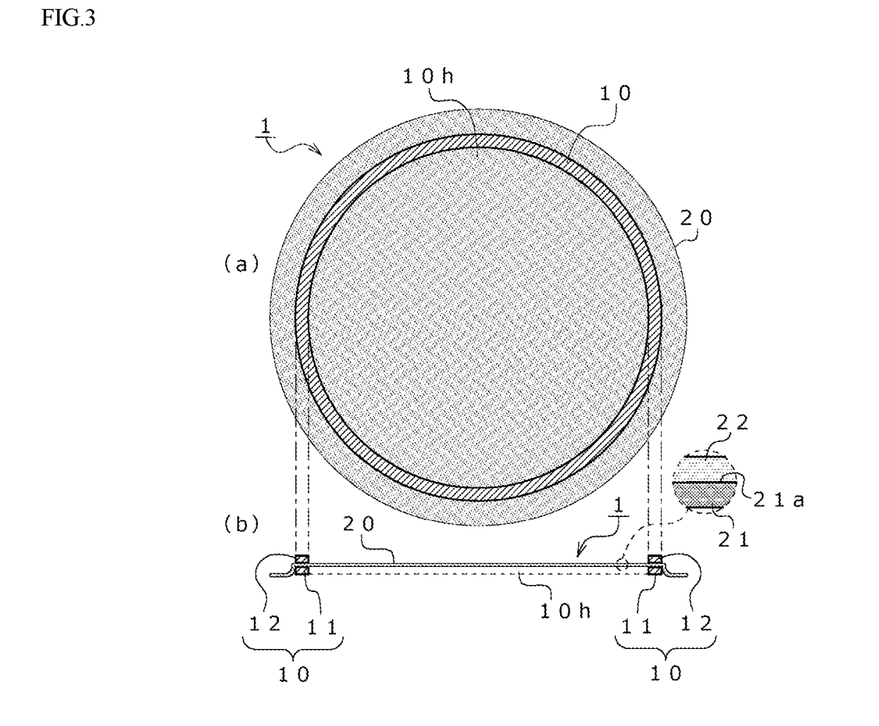
FIG. 3 is an explanatory view for explaining a planar form of another example of the present component-manufacturing tool (a), and a corresponding sectional form (b).

Also, the holding film 20 can be held while being stretched, for example, by vertically stacking the first frame 11 and the second frame 12 to be engaged with each other and by sandwiching the holding film 20 between the lower surface of the first frame 11 and the upper surface of the second frame 12, as illustrated in FIGS. 3(a) and 3(b). In this case, for example, a magnet can be embedded in each of the first frame 11 and the second frame 12 such that the lower surface of the first frame 11 and the upper surface of the second frame 12 can be engaged by magnetic force.

<2> Holding Film

The holding film 20 is a film that is sandwiched and held between the first frame 11 and the second frame 12 while stretching. This holding film 20 includes a base layer 21 and a holding layer 22 provided on a side of one surface 21a of the base layer 21 (see FIGS. 1, 3, and 6). Of these, a ratio $R_{E1}(=E'(100)/E'(25))$ of an elastic modulus E'(100) at 100° C. of the base layer 21 to an elastic modulus E'(25) at 25° C. of the base layer 21 is $0.2 \leq R_{E1} \leq 1$, and E'(25) is 35 MPa or more and 3500 MPa or less.

The above "E'(100)" represents a tensile elastic modulus at 100° C. of the base layer 21, and the above "E'(25)" represents a tensile elastic modulus at 25° C. of the base layer 21.

Arrangement of the base layer 21 and the holding layer 22 in FIGS. 1 and 3 is one example. That is, each of FIGS. 1 and 3 illustrates an example in which the base layer 21 is arranged near to the first frame 11, but the holding layer 22 may be arranged near to the first frame 11.

That is, since E'(25) of the base layer 21 is 35 MPa≤E'(25)≤3500 MPa, the holding film 20 can have flexibility, by which the holding film 20, even if held to the frame body 10 in a stretched state, can be further stretched from the state when pickup is performed. Further, since $R_{E1} \leq 1$, heat wrinkles can be prevented from occurring in the holding film 20 under a heated environment, whereby the component-manufacturing tool 1, which can be surely chucked to a chuck table, can be provided. In addition, since $R_{E1} \leq 0.2$, the component-manufacturing tool 1 can be easily separated, after evaluation, from the chuck table heated during the evaluation step. That is, if $R_{E1}<0.2$, the holding film 20 becomes easy to stick when the component-manufacturing tool is separated, even if the component-manufacturing tool can be normally chucked to the chuck table during high-temperature chuck, and hence there is a tendency that the component-manufacturing tool becomes difficult to separate in a high-temperature state. In this case, in order to separate the component-manufacturing tool 1 from the chuck table, it is necessary to take measures, such as performing forced cooling or waiting for the chuck table to cool down to a temperature at which the component-manufacturing tool becomes easy to separate; but it causes a decrease in the cycle time of the evaluation step, which is not preferable.

In order to improve an evaluation efficiency during manufacture of components, it is necessary to chuck or separate a carrier before the temperature of the chuck table cools down, as described above, but a component-manufacturing tool capable of dealing with such a situation has been currently unknown. In particular, it is extremely difficult to provide the component-manufacturing tool 1, in which the holding film 20 is stretched on the frame body 10 in a pre-stretched state, to the above evaluation step. With respect to this point, by allowing the holding film 20 of the present component-manufacturing tool 1 to have a property in which $R_{E1}$ is $0.2 \leq R_{E1} \leq 1$ and E'(25) is 35 MPa or more and 3500 MPa or less, components can be manufactured by solving the present problem, as described above.

From such a viewpoint, the ratio $R_{E1}$ is preferable to be $0.2 \leq R_{E1} \leq 1$, further preferable to be $0.23 \leq R_{E1} \leq 0.90$, further preferable to be $0.24 \leq R_{E1} \leq 0.80$, further preferable to be $0.30 \leq R_{E1} \leq 0.78$, further preferable to be $0.32 \leq R_{E1} \leq 0.75$, further preferable to be $0.35 \leq R_{E1} \leq 0.70$, and further preferable to be $0.38 \leq R_{E1} \leq 0.65$. In each of the preferred ranges, heat wrinkles can be effectively prevented even during the heating of the chuck table, and the component-manufacturing tool 1 can be easily removed from the chuck table after the chuck is stopped.

When the ratio $R_{E1}$ is within the range of $0.2 \leq R_{E1} \leq 1$, E'(25) is preferable to be 38 MPa≤E'(25)≤3000 MPa, further preferable to be 40 MPa≤E'(25)≤2000 MPa, further preferable to be 42 MPa≤E'(25)≤1000 MPa, further preferable to be 44 MPa≤E'(25)≤700 MPa, further preferable to be 46 MPa≤E'(25)≤500 MPa, further preferable to be 48 MPa≤E'(25)≤350 MPa, further preferable to be 50 MPa≤E'(25)≤250 MPa, and further preferable to be 51 MPa≤E'(25)≤150 MPa. The value of E'(25) in an MD direction of the base layer may be different from that in a TD direction of the base layer, but it is preferable that the values both in the MD direction and the TD direction fall within the above ranges.

Further, E'(100) is preferable to be 10 MPa≤E'(100)≤2000 MPa, further preferable to be 15 MPa≤E'(100)≤800 MPa, further preferable to be 17 MPa≤E'(100)≤300 MPa, further preferable to be 20 MPa≤E'(100)≤150 MPa, further preferable to be 25 MPa≤E'(100)≤50 MPa, further preferable to be 26 MPa≤E'(100)≤45 MPa, and further preferable to be 27 MPa≤E'(100)≤42 MPa. The value of E'(100) in the MD direction of the base layer may be different from that in the TD direction of the base layer, but it is preferable that the values both in the MD direction and the TD direction fall within the above ranges.

Each of the above elastic moduli E' of the base layer is measured by a dynamic viscoelasticity measuring device (DMA: Dynamic Mechanical Analysis). Specifically, each elastic modulus can be obtained by reading data at each temperature from data obtained by measuring from −50° C. to 200° C. under measurement conditions in which a sample size is 10 mm in width and 20 mm in length between chucks, a frequency is 1 Hz, and a heating rate is 5° C./min. That is, the value at 25° C. is set as the tensile elastic modulus E'(25) (unit: MPa), and the value at 100° C. is set as the tensile elastic modulus E'(100) (unit: MPa).

In the evaluation step, not only high temperatures, but also low temperatures may be loaded as described above. When evaluation is performed with not only high temperatures but also low temperatures loaded, as described above, it is preferable that the base layer 21 of the holding film 20 to be used in the present component-manufacturing tool 1 has further characteristics, in addition to the fact that $R_{E1}$ is $0.2 \leq R_{E1} \leq 1$ and E'(25) is 35 MPa or more and 3500 MPa or less. Specifically, when a ratio of an elastic modulus E'(160) at 160° C. to an elastic modulus E'(−40) at −40° C. is set as $R_{E2}(=E'(160)/E'(-40))$, it is preferable that $R_{E2}$ be 0.001 or more and 1 or less ($0.001 \leq R_{E2} \leq 1$). Herein, "E'(160)" represents a tensile elastic modulus at 160° C. of the base layer, and "E'(−40)" represents a tensile elastic modulus at −40° C. of the base layer.

When $R_{E2}$ is 0.001 $R_{E2} \leq 1$, as described above, the flexibility of the holding film 20 can be maintained even if the evaluation step is performed within each of a high temperature range of 100° C. or higher to 160° C. or lower and a low temperature range of −40° C. or higher to 0° C. or lower during component manufacturing, whereby the components 50 can be easily picked up from the holding film 20 when the components 50 are picked up after the above evaluation step. That is, in a normal state, the holding film 20 is stretched on the frame body 10 in a stretched state, and in the state, high temperatures and low temperatures (any order of load) are imposed in the evaluation step. Then, in the pickup step, the holding film 20 can be further stretched for the pickup from the stretched state previously provided, without being broken. That is, in the pickup step, only a desired component is protruded upward from the other components by further pushing up the holding film 20 to be stretched with a push-up member 92, without breaking the pushed-up portion of the holding film 20, whereby the component can be easily grasped with a pickup tool 93.

The above ratio $R_{E2}$ is preferable to be $0.001 \leq R_{E2} \leq 1$, further preferable to be $0.005 \leq R_{E2} \leq 0.7$, further preferable to be $0.007 \leq R_{E2} \leq 0.5$, further preferable to be $0.01 \leq R_{E2} \leq 0.3$, further preferable to be $0.012 \leq R_{E2} \leq 0.2$, further preferable to be $0.014 \leq R_{E2} \leq 0.1$, further preferable to be $0.016 \leq R_{E2} \leq 0.05$, and further preferable to be $0.018 \leq R_{E2} \leq 0.04$. Within these preferred ranges, the flexibility of the holding film 20 can be maintained particularly well, even if the holding film 20 has been subjected to a hot cycle.

When $R_{E2}$ is within the range of $0.001 \leq R_{E2} \leq 1$, it is preferable that E'(−40) be within the range of 10 MPa≤E'(−40)≤4500 MPa. When 10 MPa≤E'(−40)≤4500 MPa holds with the base layer 21 of the holding film 20, the holding film 20 can maintain good flexibility, even if a low temperature environment is used in the evaluation step.

As described above, evaluations of manufactured components may be performed at a low temperature as well as at a high temperature. Under a low temperature, the tensile elastic modulus E' of the base layer 21 inevitably becomes larger than that under a high temperature. Therefore, it is required that the holding film 20 stretched on the frame body 10 in a stretched state can maintain the flexibility with which the holding film 20 is not broken even when having been subjected to the low temperature during the evaluation. However, a material excellent in high temperature heat resistance is usually a material whose high temperature tensile elastic modulus is high, and the tensile elastic modulus of such a material becomes further higher at a low temperature, and hence the material becomes difficult to withstand the above situation. With respect to this point, the holding film 20, with the base layer 21 of which $0.01 \leq R_{E2} \leq 1$ and 10 MPa$\leq$E'(−40)$\leq$4500 MPa hold, can meet the above requirement.

E'(−40) is further preferable to be 50 MPa$\leq$E'(−40)$\leq$4300 MPa, further preferable to be 100 MPa$\leq$E'(−40)$\leq$3000 MPa, further preferable to be 120 MPa$\leq$E'(−40)$\leq$2000 MPa, further preferable to be 150 MPa$\leq$E'(−40)$\leq$1500 MPa, further preferable to be 180 MPa$\leq$E'(−40)$\leq$1000 MPa, further preferable to be 200 MPa$\leq$E'(−40)$\leq$700 MPa, further preferable to be 250 MPa$\leq$E'(−40)$\leq$580 MPa, further preferable to be 300$\leq$E'(−40)$\leq$550 MPa, and further preferable to be 330 MPa$\leq$E'(−40)$\leq$500 MPa. The value of E'(−40) in the MD direction of the base layer may be different from that in the TD direction of the base layer, but it is preferable that the values both in the MD direction and the TD direction fall within the above ranges.

On the other hand, E'(160) is preferable to be 0.1 MPa$\leq$E'(160)$\leq$600 MPa, further preferable to be 0.15 MPa$\leq$E'(160)$\leq$450 MPa, further preferable to be 0.2 MPa$\leq$E'(160)$\leq$300 MPa, further preferable to be 1 MPa$\leq$E'(160)$\leq$200 MPa, further preferable to be 2 MPa$\leq$E'(160)$\leq$100 MPa, further preferable to be 3 MPa$\leq$E'(160)$\leq$50 MPa, further preferable to be 4 MPa$\leq$E'(160)$\leq$40 MPa, further preferable to be 4.5 MPa$\leq$E'(160)$\leq$25 MPa, and further preferable to be 5 MPa$\leq$E'(160)$\leq$15 MPa. The value of E'(160) in the MD direction of the base layer may be different from that in the TD direction of the base layer, but it is preferable that the values both in the MD direction and the TD direction fall within the above ranges.

Each of the above elastic moduli E' of the base layer 21 is measured by a dynamic viscoelasticity measuring device (DMA: Dynamic Mechanical Analysis). Specifically, each elastic modulus can be obtained by reading data at each temperature from data obtained by measuring from −50° C. to 200° C. under measurement conditions in which a sample size is 10 mm in width and 20 mm in length between chucks, a frequency is 1 Hz, and a heating rate is 5° C./min. That is, the value at −40° C. is set as the tensile elastic modulus E'(−40), and the value at 160° C. is set as the tensile elastic modulus E'(160).

The linear thermal expansion coefficient of the base layer 21 is not limited, but it is preferable to be 100 ppm/K or more. Examples of such a material include thermoplastic elastomers as described later. That is, thermoplastic elastomers are materials having a relatively large linear thermal expansion coefficient, and the large linear thermal expansion coefficient is considered to be a driving factor for causing deformation of the holding film 20 at a high temperature. As described above, in the holding film 20 using the base layer 21 having a linear thermal expansion coefficient of 100 ppm/K or more, a wrinkle or the like tends to be caused particularly under a heated environment, so that a chucking failure to the chuck table is likely to occur. On the other hand, even if the base layer 21 having a linear thermal expansion coefficient of 100 ppm/K or more is used, a chucking failure to the chuck table under a heated environment can be prevented by setting $R_{E1}$ to be $0.2 \leq R_{E1} \leq 1$ and E'(25) to be 35 MPa or more and 3500 MPa or less.

This linear thermal expansion coefficient is preferable to be 100 ppm/K or more and 300 ppm/K or less, further preferable to be 130 ppm/K or more and 280 ppm/K or less, further preferable to be 150 ppm/K or more and 250 ppm/K or less, and further preferable to be 165 ppm/K or more and 240 ppm/K or less. This linear thermal expansion coefficient is measured according to JIS K7197, and means a thermal expansion coefficient at a temperature between 50° C. and 190° C.

The thickness of the base layer 21 is not particularly limited, and can be set to be, for example, 50 μm or more and 200 μm or less, and the thickness is preferable to be 60 μm or more and 185 μm or less, and more preferable to be 70 μm or more and 170 μm or less. In addition, the base layer may or may not be stretched.

The base layer 21 is only required to have the above various characteristics and to support the holding layer 22, and the material is not particularly limited. As the material that constitutes the base layer 21, a resin is preferable.

As the material that constitutes the base layer 21, a resin is preferable. Of resins, a resin having sufficient flexibility (mechanical elasticity) is preferable, and a resin having an elastomeric property is particularly preferable.

Examples of the resin having an elastomeric property include thermoplastic elastomers, silicones, and the like. These may be used alone or in combination of two or more. Of these, a thermoplastic elastomer is preferable because a resin having thermoplasticity is preferable. A thermoplastic elastomer may be made of a block copolymer having a hard segment and a soft segment, may be made of a polymer alloy of a hard polymer and a soft polymer, or may have properties of both of them.

In the case of including a thermoplastic elastomer, the ratio thereof can be, for example, 30% by mass or more and 100% by mass or less based on the whole resin constituting the base layer 21. That is, the resin constituting the base layer 21 may be made only of a thermoplastic elastomer. The ratio of the thermoplastic elastomer is further preferable to be 50% by mass or more and 100% by mass or less, and more preferable to be 70% by mass or more and 100% by mass or less.

Specifically, examples of the thermoplastic elastomer include a polyester-based thermoplastic elastomer, a polyamide-based thermoplastic elastomer, a styrene-based thermoplastic elastomer, an olefin-based thermoplastic elastomer, a vinyl chloride-based thermoplastic elastomer, a polyimide-based thermoplastic elastomer (polyimide ester-based, polyimide urethane-based, or the like), and the like. These may be used alone or in combination of two or more. Of these, a polyester-based thermoplastic elastomer, a polyamide-based thermoplastic elastomer, and a polyimide-based thermoplastic elastomer are preferable, and further, a polyester-based thermoplastic elastomer and/or a polyamide-based thermoplastic elastomer are particularly preferable.

The polyester-based thermoplastic elastomer may have any configuration, except that a polyester component is used as a hard segment. As a soft segment, polyester, polyether, polyether ester, or the like can be used. These may be used alone or in combination of two or more. That is, examples of a polyester component constituting the hard segment can include, for example, a structural unit derived from a monomer such as dimethyl terephthalate. On the other hand, examples of a component constituting the soft segment can include a structural unit derived from a monomer such as 1,4-butanediol and poly(oxytetramethylene)glycol.

More specifically, the examples include a PBT-PE-PBT polyester-based thermoplastic elastomer and the like.

Examples of such a polyester-based thermoplastic elastomer include "PRIMALLOY (trade name)" manufactured by Mitsubishi Chemical Corporation, "Hytrel (trade name)" manufactured by DU PONT-TORAY Co., Ltd., "PELPRENE (trade name)" manufactured by TOYOBO Co., Ltd., "HYPER ALLOY ACTYMER (trade name)" manufactured by RIKEN TECHNOS CORP., and the like. These may be used alone or in combination of two or more.

The polyamide-based thermoplastic elastomer may have any configuration, except that a polyamide component is used as a hard segment. As a soft segment, polyester, polyether, polyether ester, or the like can be used. These may be used alone or in combination of two or more. That is, examples of a polyamide component constituting the hard segment include, for example, polyamide 6, polyamide 11, polyamide 12, and the like. These may be used alone or in combination of two or more. Various lactams and the like can be used as monomers in these polyamide components. On the other hand, examples of a component constituting the soft segment can include a structural unit derived from a monomer, such as dicarboxylic acid, or polyether polyol. Of these, as the polyether polyol, polyether diols are preferable, and examples of them include, for example, poly(tetramethylene)glycol, poly(oxypropylene)glycol, and the like. These may be used alone or in combination of two or more.

More specifically, examples of them include a polyether amide-type polyamide-based thermoplastic elastomer, a polyester amide-type polyamide-based thermoplastic elastomer, a polyether ester amide-type polyamide-based thermoplastic elastomer, and the like.

Examples of such a polyamide-based thermoplastic elastomer include "Pebax (trade name)" manufactured by Arkema Inc., "Diamide (trade name)" manufactured by Daicel-Evonik Ltd., "VESTAMID (trade name)" manufactured by Daicel-Evonik Ltd., "UBESTA XPA (trade name)" manufactured by UBE INDUSTRIES, LTD., and the like. These may be used alone or in combination of two or more.

In a case where the base layer 21 contains a resin other than the thermoplastic elastomer, examples of such a resin include polyesters, polyamides, polycarbonates, acrylic resins, and the like. These may be used alone or in combination of two or more. Of these, polyesters and/or polyamides are preferable, and specifically, examples of them include polyesters such as polyethylene terephthalate, polybutylene terephthalate, polyethylene naphthalate, and polybutylene naphthalate, and polyamides such as nylon 6 and nylon 12.

Specifically, an example of the polybutylene terephthalate includes "Toraycon (trade name)" manufactured by TORAY INDUSTRIES, INC. This polybutylene terephthalate can be used alone as the base layer 21.

Further, the base layer 21 can contain, in the resin constituting the same, various additives such as a plasticizer and a softener (mineral oil or the like), a filler (carbonate, sulfate, titanate, silicate, oxide (titanium oxide, magnesium oxide), silica, talc, mica, clay, fiber filler, or the like), an antioxidant, a light stabilizer, an antistatic agent, a lubricant, a colorant, and the like. These may be used alone or in combination of two or more.

<3> Holding Layer

The holding layer 22 is a layer formed, for example, of an adhesive material or the like, so that the component 50 can be held. The holding layer 22 may be provided only on one surface of the base layer 21, or may be provided on both surfaces of the base layer 21. The holding layer 22 may be provided in direct contact with the base layer 21, or may be provided via another layer.

When the holding layer 22 is formed of an adhesive material, the adhesive force of the holding layer 22 is not particularly limited; however, it is preferable that adhesive force with respect to a silicon wafer, the adhesive force occurring when the holding layer 22 is caused to adhere to the surface of the silicon wafer and left for 60 minutes and then is peeled off from the surface of the silicon wafer, the adhesive force being measured in accordance with JIS Z0237 (under an environment in which temperature is 23° C. and relative humidity is 50%), be 0.1 to 10 N/25 mm. When the adhesive force falls within the above range, an adhesive residue, occurring when an object (i.e., the component 50), to which the holding layer 22 is adhered, is peeled off, can be suppressed, while good adhesiveness to the object is being secured. This adhesive force is more preferable to be 0.2 N/25 mm or more and 9 N/25 mm or less, and further preferable to be 0.3 N/25 mm or more and 8 N/25 mm or less.

The thickness of the holding layer 22 (the thickness on the side of one surface of the base layer 21) is not particularly limited; however, the thickness is preferable to be 1 μm or more and 40 μm or less, more preferable to be 2 μm or more and 35 μm or less, and particularly preferable to be 3 μm or more and 25 μm or less.

Of course, the holding layer 22 is a layer for providing the function to hold the component 50 to the holding film 20, and is a layer that does not inhibit the characteristics of the base layer 21 from being reflected on the holding film 20. Therefore, the holding layer 22 is a layer whose thickness is usually smaller than that of the base layer 21 and each elastic modulus described before of which is also smaller.

The adhesive material is only required to have the above characteristics, and may be made of any material. Usually, the adhesive material contains at least an adhesive main agent. Examples of the adhesive main agent include an acrylic adhesive, a silicone adhesive, a rubber adhesive, and the like. Also, this adhesive material can contain a cross-linking agent in addition to the adhesive main agent.

Further, the adhesive material may be an energy ray-curable adhesive material that can be cured by energy rays, or an energy non-curable adhesive material that is not cured by energy rays. In the case of the energy ray-curable adhesive material, the adhesive material can be cured by irradiating it with energy rays to reduce the adhesive force thereof, and an adhesive residue in the component 50, possibly occurring when the present component-manufacturing tool 1 and the component 50 are separated from each other, can be prevented. The type of the energy rays is not limited, and ultraviolet rays, electron beams, infrared rays, or the like can be used.

In the case of the energy ray-curable adhesive material, the adhesive material can contain, in addition to the above adhesive main agent, a compound having a carbon-carbon double bond in its molecule and a photopolymerization initiator that reacts with the energy rays to initiate polymerization of a curable compound. This curable compound is preferably a monomer, an oligomer, and/or a polymer having a carbon-carbon double bond in its molecule and curable by radical polymerization.

<4> Another Layer

The holding film 20 may be made only of the base layer 21 and the holding layer 22, but can be provided with another layer. Examples of the other layer include an unevenness absorption layer capable of absorbing the uneven shape of a sticking surface to make a film surface smooth, an interfacial strength improvement layer that improves interfacial strength with the adhesive material, an anti-migration layer that suppresses migration of low molecular weight components from the base layer 21 to the adhesive surface, an antistatic layer that reduces surface electrical resistance, and the like. These may be used alone or in combination of two or more.

<5> Manufacture of Holding Film

The holding film 20 may be manufactured by any method, and the method is not particularly limited. Specifically, the holding film 20 can be manufactured by a method such as a co-extrusion method, an extrusion lamination method, an adhesion lamination method, a coating method, or the like. Of these, the co-extrusion method is a method of laminating a molten resin to be the base layer 21, a molten resin to be the holding layer 22, and the like by co-extrusion, whereby the holding film 20 is manufactured.

The extrusion lamination method is a method of laminating a molten resin to be the holding layer 22, and the like on the base layer 21 by extrusion, whereby the holding film 20 is manufactured. Further, the coating method is a method of laminating a molten resin to be the holding layer 22, and the like on the base layer 21 by coating or application, whereby the holding film 20 is manufactured. When an energy ray-curable adhesive material is used as the adhesive material constituting the holding layer 22, it is preferable to use this coating method. The above adhesion lamination method is a method of laminating the base layer 21 and the holding layer 22 via thermocompression bonding, an adhesive, hot melt, or the like, whereby the holding film 20 is manufactured. These methods may be used alone or in combination of two or more.

[2] Manufacturing Method of Component

A manufacturing method of the present component includes: a component holding step (R2) (see FIGS. 5 and 6) where to the above holding layer (22) of the component-manufacturing tool (1) of the present invention, a plurality of the components (50), selected from the semiconductor component (51), a precursor (52) of the semiconductor component, the electronic component (54), and a precursor (55) of the electronic component, are held; and a chucking step (R3) (see FIG. 7) where the holding film (20), to which the components (50) are held, is chucked and fixed to a surface of a heated chuck table.

Further, the present method can include, after the chucking step (R3), an evaluation step (R4) (see FIG. 8) where the components (50) held to the holding film (20) are evaluated.

Figure 9:
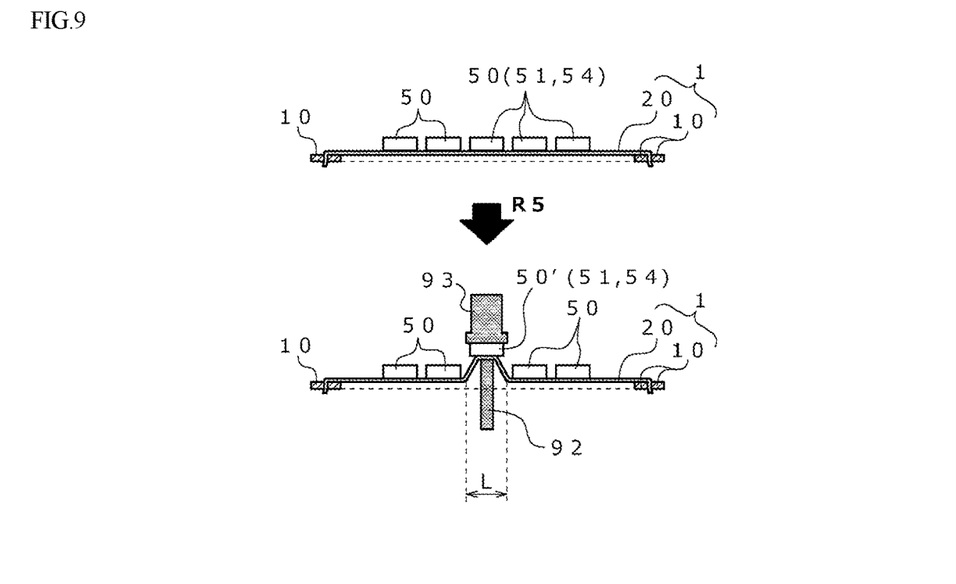
FIG. 9 is an explanatory view for explaining a pickup step according to the present method.

Furthermore, the present method can include, after the evaluation step (R4), a pickup step (R5) (see FIG. 9) where only a part (50') of the components (50) is pushed from a side of the base layer (21) toward a side of the holding layer (22) to further stretch the holding film (20), so that the component (50') is separated from the other components (50) and is picked up.

(1) Component Holding Step (R2)

The component holding step R2 is a step of holding a plurality of the components 50 to the holding layer 22 of the component-manufacturing tool 1.

Figure 5:
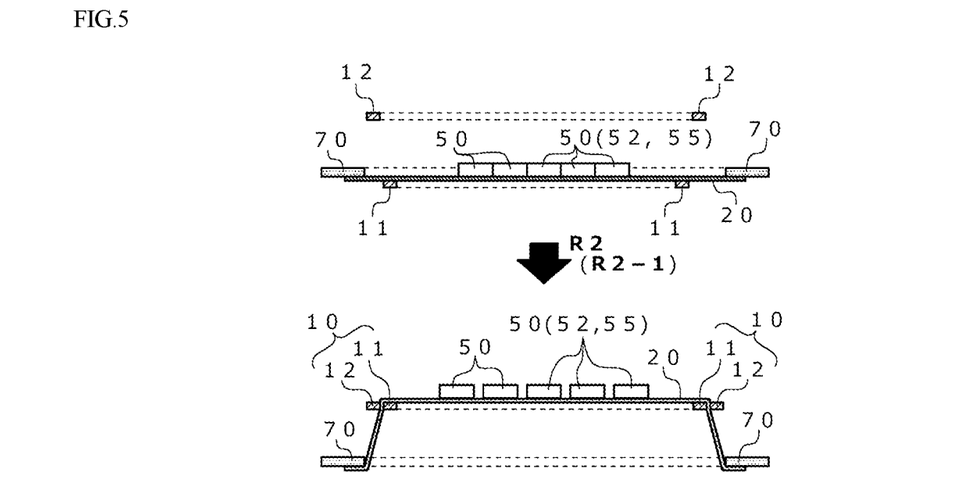
FIG. 5 is an explanatory view for explaining a frame body engagement step of a component holding step according to the present method.
Figure 6:
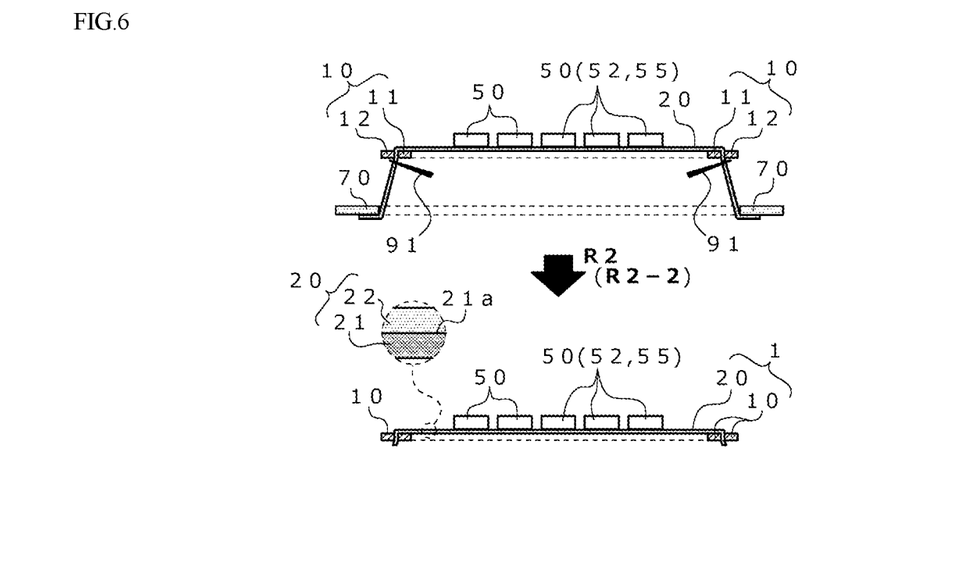
FIG. 6 is an explanatory view for explaining a film cut step of the component holding step according to the present method.

A holding method in this case is not particularly limited, and the back faces of the plurality of the divided components 50 may be respectively caused to adhere to the holding layer 22 of the holding film 20 such that the components are held; however, the components can be held by cutting out an area, which is part of a film 25 (a precursive holding film) to which the components 50 are held, from a ring frame 70 on which the film 25, to which the components 50 are held, is cut with the use of the frame body 10, as illustrated in FIGS. 5 and 6.

Figure 4:
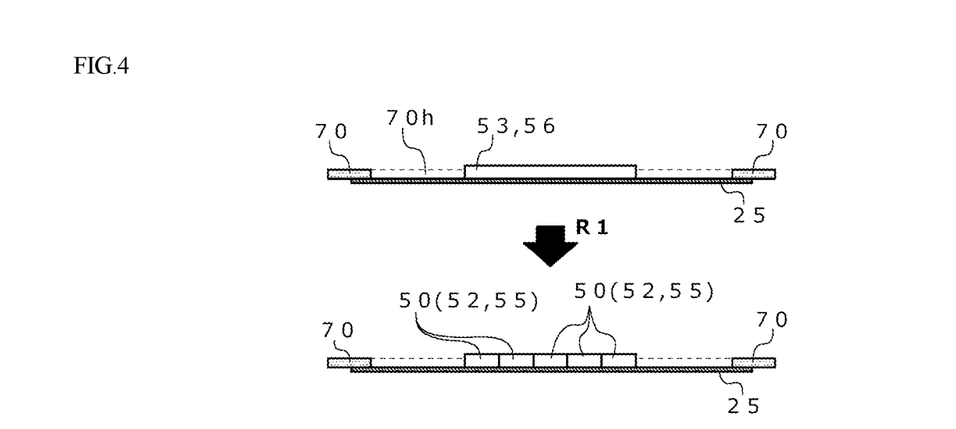
FIG. 4 is an explanatory view for explaining a dividing step according to the present method.

More specifically, the components 50 can be obtained by performing a dividing step R1 (see FIG. 4) where a semiconductor wafer 53 or an array-shaped electronic component 56, which is held in advance to the film 25 (the precursive holding film) stretched on the ring frame 70, is divided to obtain the components 50, as illustrated in FIG. 4.

Thereafter, for example, the second frame 12 is arranged on the side of the surface of the precursive holding film 25 in a state where the components 50 are held to the precursive holding film 25, and the precursive holding film 25 is stretched by raising the first frame 11 that is brought into contact with the back surface of the precursive holding film 25, whereby the components 50 are separated from each other on the precursive holding film 25 and the first frame 11 and the second frame 12 are engaged with each other. Thereby, the frame body 10 is formed with the first frame 11 and the second frame 12 engaged with each other, and the precursive holding film 25 stretched on the frame body 10 can be obtained in a state of being stretched to cover the opening 10h (see FIG. 5). Thereafter, by cutting the precursive holding film 25 into small pieces near the frame body 10 with the use of a cutting blade 91, the frame body 10 and the holding film 20 stretched on the frame body 10 so as to cover the opening 10h can be obtained (see FIG. 6). Thereby, a state can be obtained, where the divided components 50 are held onto the obtained holding film 20 such that they are separated from each other so as not to contact each other.

That is, the components 50 can be obtained by dividing the semiconductor wafer 53 or the array-shaped electronic component 56 that is held in advance to the film 25 (the precursive holding film) stretched on the ring frame 70 (through the dividing step R1) (see FIG. 4). Thereafter, by attaching the frame body 10 to the precursive holding film 25 in an area where the divided components 50 are held (a frame body engagement step R2-1) (see FIG. 5) and then by cutting out only the holding film 20 held to the frame body 10 (a film cut step R2-2) (see FIG. 6), the component holding step R2 can be performed.

Therefore, the component holding step R2 can include the frame body engagement step R2-1 and the film cut step R2-2. The frame body engagement step R2-1 is a step where the frame body 10 is completed by engaging the first frame 11 and the second frame 12 so as to sandwich the precursive holding film 25, to which the divided components 50 are held, from both sides of the film (see FIG. 5). The film cut step R2-2 is a step where only the holding film 20 held to the frame body 10 is cut out (see FIG. 6).

The components 50 are components selected from the semiconductor component 51, the precursor 52 of the semiconductor component, the electronic component 54, and the precursor 55 of the electronic component. All of these components are divided components, and they include, for example, components obtained by dividing the semiconductor wafer 53 or the array-shaped electronic component 56. That is, the precursor 52 of a semiconductor component that is divided from the semiconductor wafer 53, and the semiconductor component 51, made by subjecting the precursor 52 of a semiconductor component to predetermined steps (e.g., the evaluation step, and the like), are included. Similarly, the precursor 55 of an electronic component that is divided from the array-shaped electronic component 56, and the electronic component 54, made by subjecting the precursor 55 of an electronic component to predetermined steps (e.g., the evaluation step, and the like), are included.

When the component 50 is the semiconductor component 51 or the precursor 52 of the semiconductor component, the substrate constituting these components is not particularly limited, and examples of the substrate include silicon, sapphire, germanium, germanium-arsenic, gallium-phosphorus, gallium-arsenic-aluminum, and the like. In the semiconductor component 51 or the precursor 52 of the semiconductor component, circuits are formed on the above substrate.

Examples of the circuits include wiring, a capacitor, a diode, a transistor, and the like. These may be used alone or in combination of two or more.

The array-shaped electronic component 56 is a component in which the precursors 55 of electronic components are integrated in an array shape. The array-shaped electronic component 56 includes the following forms (1) to (3).

(1): The array-shaped electronic component 56 obtained by: arraying, on a lead frame, the semiconductor components 51 (chips, dies) obtained from the semiconductor wafer 53 on which circuits are formed; wire-bonding them; and then sealing them with a sealant.

(2): The array-shaped electronic component 56 obtained by: separately arraying the semiconductor components 51 (chips, dies) obtained from the semiconductor wafer 53 on which circuits are formed; sealing them with a sealant; and then collectively forming external circuits for obtaining conduction with the outside, such as a rewiring layer and a bump electrode. That is, the array-shaped electronic component 56 obtained in a fan-out method (eWLB method).

(3): The array-shaped electronic component 56 obtained by using the semiconductor wafer 53 in a wafer state as it is; and collectively forming external circuits for obtaining conduction with the outside, such as a rewiring layer and a bump electrode, and a sealed layer sealed with a sealant. The semiconductor wafer 53 in the form (3) includes: a form in a state before being divided, where the semiconductor components 51 (chips, dies) are formed in an array shape; a form where the semiconductor wafer 53 is used as a substrate (a form where a chip having circuits is joined onto a non-circuit silicon substrate to be used); and the like. That is, the array-shaped electronic component 56 in the form (3) is the array-shaped electronic component 56 obtained in a wafer-level chip size package (WLCSP) method.

When the semiconductor wafer 53 is divided, it may be divided such that at least one semiconductor circuit area is included in one precursor 52, or may be divided such that two or more semiconductor circuit areas are included. Similarly, when the array-shaped electronic component 56 is divided, it may be divided such that at least one semiconductor component is included in one precursor 55, or may be divided such that two or more semiconductor components are included.

(2) Chucking step (R3)

Figure 7:
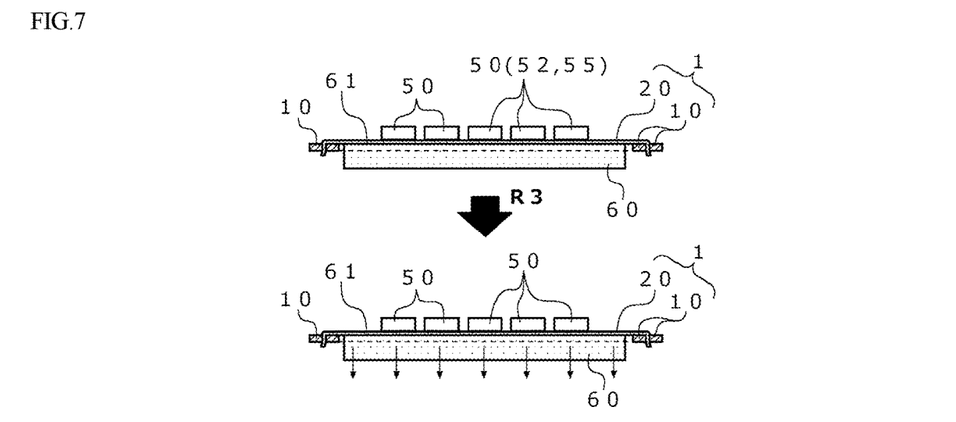
FIG. 7 is an explanatory view for explaining a chucking step according to the present method.

The chucking step R3 is a step where the holding film 20, to which the components 50 are held, is chucked and fixed to a surface 61 of a heated chuck table 60 (see FIG. 7).

Figure 10:
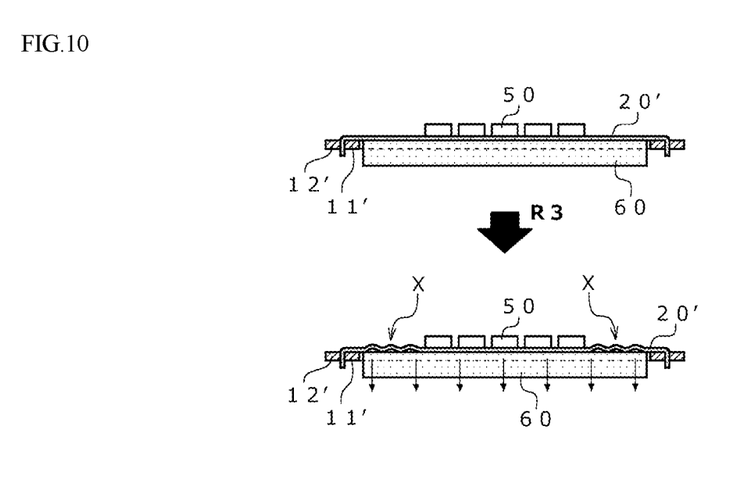
FIG. 10 is an explanatory view for explaining a problem of a conventional component-manufacturing tool.

As described before, there have been the cases with conventional component-manufacturing tools, where when the tool is tried to be chucked and fixed to the heated chuck table 60, a wrinkle X occurs in a holding film 20' in a circumferential portion of the held component 50, which causes chucking leak from the wrinkle X, whereby the tool cannot be normally chucked and fixed to the chuck table 60. On the other hand, by using the present component-manufacturing tool 1, the tool 1 can be normally chucked and fixed to the surface 61 of the chuck table 60 by suppressing occurrence of the wrinkle X (see FIG. 7).

As described before, the chuck table 60 usually includes a table (top board) having a smooth top face (the surface 61). Of course, the "smooth" means that the top face, excluding a chucking route such as a chucking hole or a chucking groove, is smooth.

The "heated chuck table 60" means that the chuck table 60 is heated to a temperature higher than the temperature of an operating environment. Specifically, a situation is taken into consideration, in which: in order to perform the evaluation step R4 after the chucking step R3, the component-manufacturing tool 1 is chucked to the preheated chuck table 60; in order to increase the time cycle of the evaluation step R4, the component-manufacturing tool 1, to which the components of the next lot are held, is continuously chucked without fully allowing the chuck table 60 to cool down or cooling the chuck table 60; or the like. Above all, a case is taken into consideration in the present method, where the component-manufacturing tool 1 is chucked to the chuck table 60, the temperature of the surface 61 of which is 70° C. or higher. The temperature of the surface 61 is usually 200° C. or lower, further can be 75° C. or higher and 190° C. or lower, further can be 80° C. or higher and 180° C. or lower, further can be 85° C. or higher and 170° C. or lower, and further can be 90° C. or higher and 160° C. or lower. That is, the present component-manufacturing tool 1 can deal with the chuck table 60 whose temperature falls within such temperature ranges.

The present method can include other steps in addition to the above component holding step R2 and chucking step R3. Examples of the other steps include the dividing step R1, the evaluation step R4, and the pickup step R5. Of these, the dividing step R1 is as described above.

That is, the dividing step R1 (see FIG. 4) is a step performed before the component holding step R2, where the component 50 is obtained by dividing the semiconductor wafer 53 or the array-shaped electronic component 56. For example, the components 50 can be obtained by dividing the semiconductor wafer 53 or the array-shaped electronic component 56 that is held in advance to the film 25 (the precursive holding film) stretched on the ring frame 70.

The shape of the ring frame 70 is not particularly limited, but it usually has an opening 70h larger than the opening 10h of the frame body 10.

The evaluation step R4 (see FIG. 8) is a step where after the chucking step R3, the component 50 held to the holding film 20 is evaluated. The evaluation method is not particularly limited, but, for example, it can be determined by using a prober whether the electrical characteristics of a circuit of the component 50 in the state of being held to the holding film 20 can exert desired characteristics within a predetermined temperature range (e.g., 100° C. or higher and 170° C. or lower). This evaluation can include one aiming at confirming operation within a desired temperature range, and one aiming at an accelerated endurance test within a desired temperature range (e.g., a burn-in test).

Figure 8:
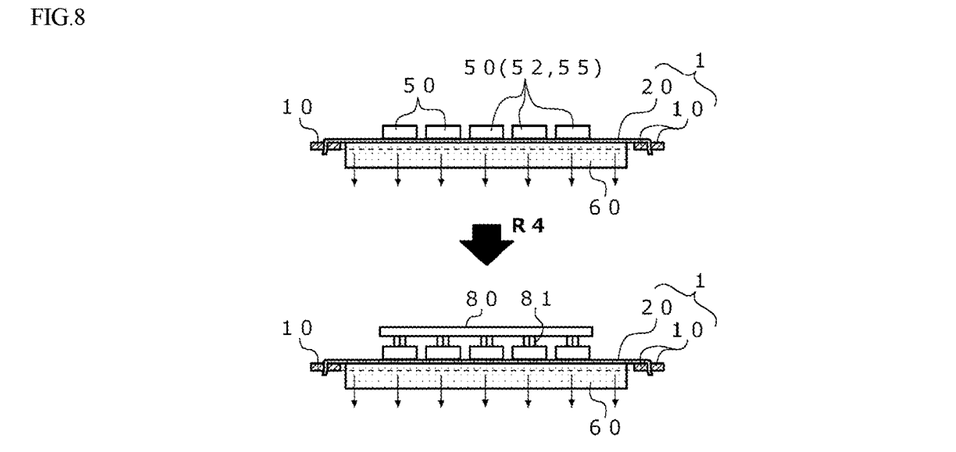
FIG. 8 is an explanatory view for explaining an evaluation step according to the present method.

Specifically, it can be determined whether a signal to be exchanged between a probe 81 and a circuit formed on each component 50 is correct (probe test), for example, by forming electrical connection with a probe card 80, on which a plurality of the probes 81 are formed, brought into contact with a predetermined corresponding portion of the component 50 (see FIG. 8). The evaluations include non-contact optical evaluation in addition to the electrical evaluation (probe test) performed by contacting the probe, as described above. When there are multiple components 50 held to the holding film 20, the number of the components 50 to be evaluated in the evaluation step R4 is not limited. That is, the evaluation step R4 may be a step of evaluating all the components 50, or may be a step of evaluating only a part of components 50.

Further, the pickup step (R5) (see FIG. 9) is a step where after the evaluation step R4, only a part of component 50' of the components 50 is pushed from a side of the base layer 21 toward a side of the holding layer 22 to further stretch the holding film 20, so that the component 50' is separated from the other components 50 and is picked up.

The flexibility of the holding film 20 to be used in the present component-manufacturing tool 1 is maintained throughout the respective steps, so that the component-manufacturing tool 1 can have a high pickup property. Specifically, only a portion of the film, to which the components to be picked up are adhered, can be deformed in the pickup step. That is, the area of a peripheral film to be lifted following the pushup with the push-up member 92 can be reduced, and a diameter L (see FIG. 9) of a circular portion to be lifted with the pushup can be reduced. Thereby, a failure, such as unintended lifting of a component not to be picked up, can be prevented. In the case of a film that cannot maintain sufficient flexibility, the area of a peripheral film to be unintentionally lifted with the pushup is large, and hence there is a fear of occurrence of a failure that another component (a component not to be picked up), existing next to a component to be picked up, may be lifted simultaneously or obliquely, so that the components may collide with each other, or the like. With respect to this point, the present method uses the above component-manufacturing tool 1, whereby such a failure can be prevented.

The pickup step can be appropriately performed by using a known method, and for example, the components 50 to be picked up are pushed up with the push-up member 92 from the side of the base layer 21 of the holding film 20, so that the pushed-up components 50 can be picked up by a method, such as chucking, using the pickup tool 93.

EXAMPLES

Hereinafter, the present invention will be specifically described by way of examples.

[1] Manufacture of Component-Manufacturing Tool

<1> Manufacture of Holding Film 20

Experimental Example 1

(1) Base Layer

A polybutylene terephthalate (PBT) film having a thickness of 75 μm was prepared as the base layer 21. This film was used to measure the tensile elastic modulus E' by a dynamic viscoelasticity measuring device (DMA: Dynamic Mechanical Analysis) (product name: RSA-3, manufactured by TA Instruments, Inc.). Specifically, data at each temperature was read from data obtained by measuring from −50° C. to 200° C. under measurement conditions in which a sample size was 10 mm in width and 20 mm in length between chucks, a frequency was 1 Hz, and a heating rate was 5° C./min. The value at −40° C. was set as the tensile elastic modulus E'(−40), the value at 25° C. as the tensile elastic modulus E'(25), the value at 100° C. as the tensile elastic modulus E'(100), and the value at 160° C. as the tensile elastic modulus E'(160), which were shown in Table 1. Further, the value of the ratio $R_{E1}$(=E'(100)/E'(25)) and the value of the ratio $R_{E2}$(=E'(160)/E'(−40)) were calculated by using these values, and the results thereof were also shown in Table 1. As a result, the ratio $R_{E1}$ was 0.25 and the ratio $R_{E2}$ was 0.06 in Experimental Example 1.

(2) Holding Layer

A non-curable acrylic adhesive having a thickness of 10 μm was used as the holding layer 22.

(3) Lamination of Base Layer and Holding Layer

The holding layer 22 of the above (2) was laminated on one surface of the base layer 21 of the above (1) to obtain the holding film 20 of Experimental Example 1.

Experimental Example 2

(1) Base Layer

A nylon-based thermoplastic elastomer (TPAE) film having a thickness of 150 μm was prepared as the base layer 21. Like Experimental Example 1, this film was used to measure the tensile elastic modulus E' and to calculate the ratios $R_{E1}$ and $R_{E2}$, the results of which were shown in Table 1. As a result, the ratio $R_{E1}$ was 0.34 and the ratio $R_{E2}$ was 0.001 in Experimental Example 2.

(2) Holding Layer

A non-curable acrylic adhesive having a thickness of 10 μm was used as the holding layer 22.

(3) Lamination of Base Layer and Holding Layer

The holding layer 22 of the above (2) was laminated on one surface of the base layer 21 of the above (1) to obtain the holding film 20 of Experimental Example 2.

Experimental Example 3

(1) Base Layer

A polyester-based thermoplastic elastomer (TPEE) film having a thickness of 80 μm was prepared as the base layer 21. Like Experimental Example 1, this film was used to measure the tensile elastic modulus E' and to calculate the ratios $R_{E1}$ and $R_{E2}$, the results of which were shown in Table 1. As a result, the ratio $R_{E1}$ was 0.4 and the ratio $R_{E2}$ was 0.03 in Experimental Example 3.

(2) Holding Layer

A non-curable acrylic adhesive having a thickness of 10 μm was used as the holding layer 22.

(3) Lamination of Base Layer and Holding Layer

The holding layer 22 of the above (2) was laminated on one surface of the base layer 21 of the above (1) to obtain the holding film 20 of Experimental Example 3.

Experimental Example 4

(1) Base Layer

A polyester-based thermoplastic elastomer (TPEE) film having a thickness of 150 μm was prepared as the base layer 21. This film is a film whose thickness is only different from the film of Experimental Example 3.

(2) Holding Layer

A non-curable acrylic adhesive having a thickness of 10 μm was used as the holding layer 22.

(3) Lamination of Base Layer and Holding Layer

The holding layer 22 of the above (2) was laminated on one surface of the base layer 21 of the above (1) to obtain the holding film 20 of Experimental Example 4.

Experimental Example 5

(1) Base Layer

A polyester-based thermoplastic elastomer (TPEE) film having a thickness of 120 μm was prepared as the base layer 21. Like Experimental Example 1, this film was used to measure the tensile elastic modulus E' and to calculate the ratios $R_{E1}$ and $R_{E2}$, the results of which were shown in Table 1. As a result, the ratio $R_{E1}$ was 0.6 and the ratio $R_{E2}$ was 0.02 in Experimental Example 5.

(2) Holding Layer

A non-curable acrylic adhesive having a thickness of 10 μm was used as the holding layer 22.

(3) Lamination of Base Layer and Holding Layer

The holding layer 22 of the above (2) was laminated on one surface of the base layer 21 of the above (1) to obtain the holding film 20 of Experimental Example 5.

TABLE 1

|  |  | Experimental Example | | | | |
|---|---|---|---|---|---|---|
|  |  | 1 | 2 | 3 | 4 | 5 |
| Base layer | Resin | PBT | TPAE | TPEE | TPEE | TPEE |
|  | Thickness (μm) | 75 | 150 | 80 | 150 | 120 |
|  | Linear thermal expansion coefficient (ppm/K) | 188 | 200 | 210 | 210 | 220 |
|  | E'(25) (MPa) | 550 | 72 | 95 | 95 | 56 |
|  | E'(100) (MPa) | 138 | 24 | 38 | 38 | 32 |
|  | $R_{E1}$ | 0.25 | 0.34 | 0.4 | 0.4 | 0.6 |
|  | E'(−40) (MPa) | 1500 | 280 | 440 | 440 | 374 |
|  | E'(160) (MPa) | 90 | 0.27 | 12 | 12 | 8.5 |
|  | $R_{E2}$ | 0.06 | 0.001 | 0.03 | 0.03 | 0.02 |
| Chucking and Fixation |  | ○ | ○ | ○ | ○ | ○ |

<2> Manufacture of Component-Manufacturing Tool

Component-manufacturing tools of Experimental Examples 1 to 5 were obtained in the following way in which each of the holding films 20 of Experimental Examples 1 to 5 was stretched to an extent of being stretched evenly around by 2 mm by using the first frame 11 having an outer diameter of 179 mm and an inner diameter (the diameter of the opening 11h was 169 mm) and the second frame 12 having an outer diameter of 182 mm and an inner diameter (the diameter of the opening 12h was 179 mm) (each of the holding films 20 was held at the state of being sandwiched by the first frame 11 and the second frame 12).

<3> Evaluation of Component-Manufacturing Tool

The surface of the base layer 21 of the holding film 20 of each of the component-manufacturing tools 1 of Experimental Examples 1 to 5 obtained up to the above <2> was chucked and fixed to the surface 61 of the chuck table 60 of a vacuum chucking type, the temperature of which was set to 120° C. The chucking and fixation states at this time were evaluated according to the following criteria, the results of which were shown in Table 1.

"○": well chucked and fixed.

"Δ": able to be chucked and fixed, but a slight wrinkle was observed.

"×": the holding film was corrugated, and was not able to be chucked and fixed.

[2] Effect of Examples

The ratio $R_{E1}$(=E'(100)/E'(25)) of E'(100) of the base layer 21 of each of Experimental Examples 1 to 5 to E'(25) of the base layer 21 falls within the range of $0.2 \leq R_{E1} \leq 1$. In addition, E'(25) of the base layer 21 of each of Experimental Examples 1 to 5 falls within the range of 35 MPa or more to 3500 MPa or less. With a component-manufacturing tool using such a base layer 21, the tool can be normally chucked to a high-temperature chuck table of a vacuum chucking type, and heat wrinkles are not recognized at all. As a result, a component-manufacturing tool, which can be chucked to a chuck table even under a heated environment, and a component-manufacturing method can be provided.

Note that the present invention is not limited to the above specific examples but can be variously modified within the scope of the present invention depending on the purpose and use.

INDUSTRIAL APPLICABILITY

The component-manufacturing tool and the component-manufacturing method of the present invention are widely used in applications of semiconductor component manufacturing and electronic component manufacturing. When a component-manufacturing method, including an evaluation step under a heated environment, a dividing step, and a pickup step, is used, the component-manufacturing tool and the component-manufacturing method can be suitably used from the viewpoint of performing component manufacture excellent in productivity.

REFERENCE SIGNS LIST

1 Component-manufacturing tool
10 Frame body
10h Opening
11 First frame
11h Opening
12 Second frame
12h Opening
20 Holding film
21 Base layer
22 Holding layer
50 Component
51 Semiconductor component
52 Precursor of semiconductor component (divided precursor)
53 Semiconductor wafer (precursor before being divided)
54 Electronic component
55 Precursor of electronic component (divided precursor)
56 Array-shaped electronic component (precursor before being divided)
60 Chuck table
61 Surface (surface of chuck table capable of performing chucking)
70 Ring frame
71 Opening of ring frame
80 Probe card
81 Probe
91 Cutting blade
92 Push-up member
93 Pickup tool
R1 Dividing step
R2 Component holding step
R2-1 Frame body engagement step
R2-2 Film cut step
R3 Chucking step
R4 Evaluation step
R5 Pickup step

The invention claimed is:

1. A component-manufacturing method comprising:
a component holding step where a plurality of components selected from a semiconductor component, a precursor of the semiconductor component, an electronic component, and a precursor of the electronic component are held to a holding layer of a component-manufacturing tool that includes
a frame body having an opening, and a holding film stretched on the frame body so as to cover the opening,
the frame body including a ring-shaped first frame and a ring-shaped second frame capable of being engaged with the first frame,
the holding film including a base layer and the holding layer provided on one surface of the base layer and being sandwiched and held between the first frame and the second frame in a stretched state, and a ratio $R_{E1}(=E'(100)/E'(25))$ of an elastic modulus $E'(100)$ at 100° C. of the base layer to an elastic modulus $E'(25)$ at 25° C. of the base layer being $0.2<R_{E1}\leq 1$ and $E'(25)$ being 35 MPa or more and 3500 MPa or less;

a chucking step where the components are fixed to a surface of a heated chuck table via the holding film by chucking the holding film on which the components are held, and after the chucking step, an evaluation step where the components held to the holding film are evaluated.

2. The component-manufacturing method according to claim 1, comprising, after the evaluation step, a pickup step where only a part of the components is pushed from a side of the base layer toward a side of the holding layer to further stretch the holding film, so that the component is separated from the other components and is picked up.

3. The component-manufacturing method according to claim 1, wherein the evaluation step is a step of evaluating an electrical characteristic of the plurality of components by contacting a probe.

4. The component-manufacturing method according to claim 3, wherein an evaluating temperature range is 100° C. or higher.

* * * * *

UNITED STATES PATENT AND TRADEMARK OFFICE
CERTIFICATE OF CORRECTION

| | |
|---|---|
| PATENT NO. | : 11,984,341 B2 |
| APPLICATION NO. | : 16/610161 |
| DATED | : May 14, 2024 |
| INVENTOR(S) | : Eiji Hayashishita |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1043 days.

Signed and Sealed this
Tenth Day of June, 2025

Coke Morgan Stewart
*Acting Director of the United States Patent and Trademark Office*